United States Patent
Chang et al.

[11] Patent Number: 6,103,639
[45] Date of Patent: Aug. 15, 2000

[54] METHOD OF REDUCING PIN HOLES IN A NITRIDE PASSIVATION LAYER

[75] Inventors: Tony Chang; Shiang-Peng Cheng, both of Hsinchu, Taiwan

[73] Assignee: Vanguard International Semiconductor Corporation, Hsinchu, Taiwan

[21] Appl. No.: 08/984,354

[22] Filed: Dec. 3, 1997

[51] Int. Cl.⁷ ................................................ H01L 21/31
[52] U.S. Cl. .................... 438/778; 438/775; 438/787; 438/659; 438/688; 438/788; 438/792; 438/798
[58] Field of Search ................................ 438/623, 688, 438/795, 974, 746, 756, 659, 775, 778, 787, 788, 792, 798

[56] References Cited

U.S. PATENT DOCUMENTS 5,262,279  11/1993  Tsang et al. ............................. 430/311
5,753,319   5/1998  Knapp et al. ............................ 427/529
5,807,787  12/1996  Fu et al. ................................. 438/623

*Primary Examiner*—David Nelms
*Assistant Examiner*—Reneé R. Berry
*Attorney, Agent, or Firm*—Christensen O'Connor Johnson Kindness PLLC

[57] ABSTRACT

A metal interconnection is formed on a dielectric layer. A pre-treatment is then performed to remove organic materials on the surface of the metal layer. The pre-treatment is done by plasma bombardment using $NH_3$ and $NO_2$ as the reaction gases. A thin oxide layer is subsequently deposited on the metal layer and on the dielectric layer. The oxide layer serves a buffer layer to eliminate the stress between the metal layer and subsequent silicon nitride layer. A silicon nitride layer is then formed on the thin oxide layer to act as a passivation layer.

22 Claims, 2 Drawing Sheets

METHOD OF REDUCING PIN HOLES IN A NITRIDE PASSIVATION LAYER

FIELD OF THE INVENTION

The present invention relates to a method of manufacturing a passivation layer for a semiconductor integrated circuit (IC), and more specifically, to a method of forming a pin hole free passivation layer for a semiconductor device.

BACKGROUND OF THE INVENTION

To manufacture integrated circuits involves the formation of metal interconnections isolated between insulator layers. The interconnection provides specific conducting paths for electrical signals moving between semiconductor devices. A metal layer or alloy is usually serves as the interconnection. Devices isolated from one another must first be formed in the silicon substrate. Then, they are interconnected via these interconnections to form some desired circuit function.

Aluminum or aluminum alloy thin film is widely used as the interconnect structure in the manufacture of ICs. In addition, Al is generally used as the top level in a multilevel-metal structure because wire-bonding technology to Al thin films is a well known and characterized process. Further, the addition of alloy materials to Al is used to alleviate well known problems, such as electromigration and spiking. The films of Al for VLSI interconnections are commonly deposited by DC magnetron sputtering. Other materials used for interconnection include tungsten and titanium.

Typically, a dielectric layer must be deposited on the metal layer to electrically isolate one level of conductor from another layer in a multiple layer interconnect structure. The dielectric layer that is formed on the top of the multi-interconnection is called the passivation layer. The purpose of the passivation layer is not only for electric isolation, but also for protecting the interconnect. For example, the passivation layer prevents moisture from penetrating into the device. However, pin holes are often times formed during conventional formation of passivation layers.

SUMMARY OF THE INVENTION

A method of forming a passivation layer on a silicon wafer, said silicon wafer having a dielectric layer formed thereon, is disclosed. The method comprises: forming a conductive layer on said dielectric layer; patterning and etching said conductive layer to form interconnections; performing a pre-treatment by using $NH_3$ and $N_2O$ plasma to remove any organic material on said conductive layer or said dielectric layer; forming a silicon oxide layer on said conductive layer and said dielectric layer to act as a buffer layer; and forming a silicon nitride layer on said silicon oxide layer for passivation.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

A method is disclosed to form a passivation layer on a metal layer to suppress the pin hole effect. The present invention will be described as follows in detail.

Figure 1:
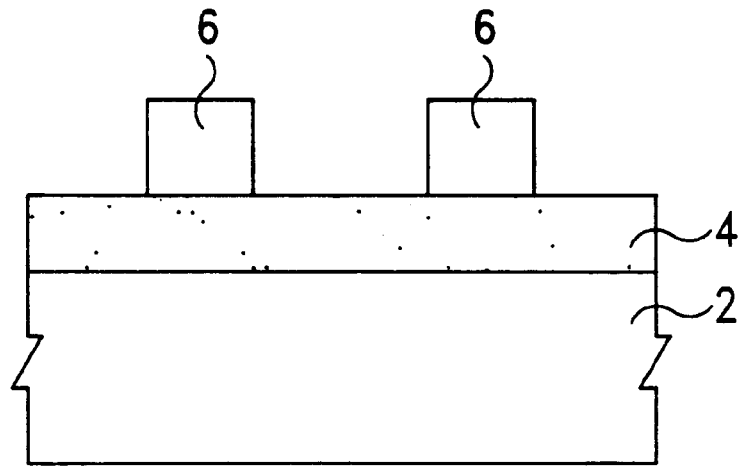
FIG. 1 is a cross section view of a semiconductor wafer illustrating the step of forming a metal layer over the substrate in accordance with the present invention.

Turning to FIG. 1, a silicon substrate 2 is shown that can be of p type or n type silicon with <100> crystallographic orientation. A semiconductor device is created in the substrate 2 in a conventional manner. Next, isolation layers and interconnection layers are formed over the substrate 2 for isolation and interconnection by using well known technologies.

Subsequently, a metal layer 6 is formed on a dielectric layer 4 that is formed over the substrate 2. Similarly, the metal layer 6 is also used for electric connection. The metal layer can be selected from the group of aluminum, titanium, tungsten, cooper, gold (Au), platinum and other alloys.

Next, a photoresist is patterned on the metal layer 6 to define the pattern of the metal layer 6. Then, an etching process is used to etch the metal layer 6 by using the photoresist as an etching mask. Typically, the thickness of the metal later is about 6000 to 9000 angstroms. The photoresist is then stripped away. During this process of patterning and etching the metal layer 6, organic material often times will be formed on the surface of the metal layer 6 and the dielectric layer 4. The foregoing steps are conventional and are known in the art.

Figure 2:
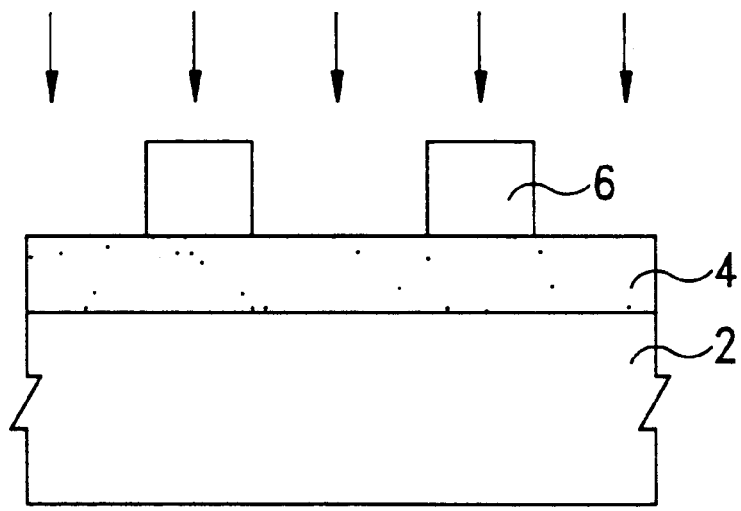
FIG. 2 is a cross section view of a semiconductor wafer illustrating the step of performing a pre-treatment process in accordance with the present invention.

Turning to FIG. 2, in accordance with the present invention, a pre-treatment is performed in order to remove organic materials on the surface of metal layer 6. The pre-treatment is done by plasma bombardment using $NH_3$ and $N_2O$ as the reaction gases. In one actual embodiment, the pressure of this step is about 2.5 torrs. The power of the plasma in the radio frequency (RF) domain is about 100 watts. The susceptor spacing is about 450 mils. The flow rate of the $NH_3$ and $N_2O$ is about 100 sccm and 1600 sccm, respectively.

Figure 3:
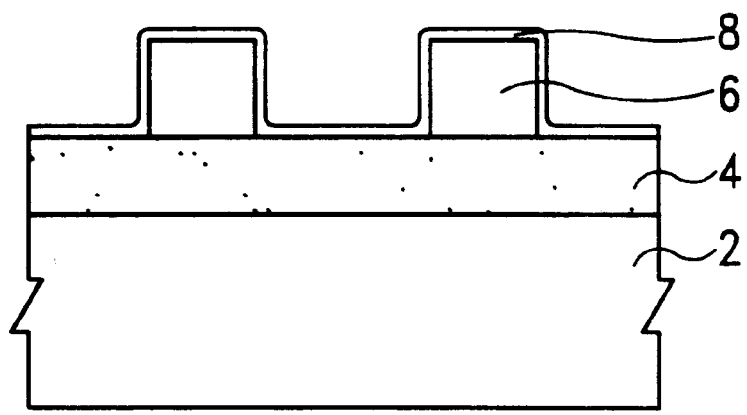
FIG. 3 is a cross section view of a semiconductor wafer illustrating the steps of forming a silicon oxide layer on the metal layer in accordance with the present invention.

Turning next to FIG. 3, a thin silicon oxide layer 8 is subsequently deposited on the metal layer 6 and on the dielectric layer 4 by using chemical vapor deposition. The oxide layer 8 serves as a buffer layer to eliminate the stress between the metal layer and a subsequent silicon nitride layer. Preferably, the pressure of the process is at about 2.5 torrs. The power of the deposition in the RF domain is about 240 watts. The susceptor spacing is about 430 mils. The flow rate of the reaction gas $SiH_4$ is about 90 sccm. The flow rate of the $N_2O$ is about 1600 sccm. The temperature of the deposition is about 200 to 400° C. The thickness of the silicon oxide layer 8 is about 300 to 3000 angstroms.

Figure 4:
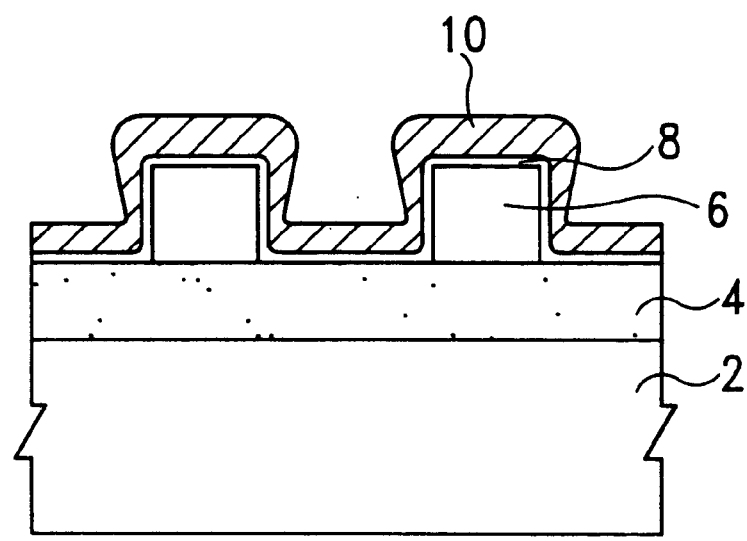
FIG. 4 is a cross section view of a semiconductor wafer illustrating the step of forming a passivation layer on the silicon oxide layer in accordance with the present invention.

Turning next to FIG. 4, a silicon nitride layer 10 is then formed on the thin oxide layer 8 to act as a passivation layer 6. The silicon nitride layer 6 can be formed by any one of the conventional methods. For example, low pressure chemical vapor deposition (LPCVD), plasma enhance chemical vapor deposition (PECVD), or high density plasma chemical vapor deposition (HDPCVD) may be used. The silicon nitride layer 10 is deposited at a temperature of about 200 to 400° C. by chemical vapor deposition. In one actual embodiment, the process is done using a pressure in the range of 3.35 torrs. Further, the power of the reaction is about 760 watts. The susceptor spacing is about 650 mils. In addition, $SiH_4$ and $NH_3$ are utilized to serve as the reaction gas. The flow rate of the $SiH_4$ and $NH_3$ are respectively 270 and 80 sccm. Pin holes will be substantially eliminated using the "recipe" of the present invention.

As is understood by a person skilled in the art, the foregoing preferred embodiment of the present invention is illustrated of the present invention rather than limiting of the present invention. It is intended to cover various modifications and similar arrangements included within the spirit and scope of the appended claims, the scope of which should be accorded the broadest interpretation so as to encompass all such modifications and similar structure.

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A method of forming a passivation layer on a silicon wafer, said silicon wafer having a dielectric layer formed thereon, said method comprising:

forming a conductive layer on said dielectric layer;

patterning and etching said conductive layer to form interconnections;

performing a pre-treatment by using $NH_3$ and $N_2O$ plasma to remove any organic material on said conductive layer or said dielectric layer;

forming a silicon oxide layer on said conductive layer and said dielectric layer to act as a buffer layer; and forming a silicon nitride layer on said silicon oxide layer for passivation.

2. The method of claim 1, wherein said pre-treatment is done at a pressure of about 2.5 torr.

3. The method of claim 1, wherein said pre-treatment is done at a power of about 100 watts.

4. The method of claim 1, wherein the flow rate of said $N_2O$ is about 1600 sccm.

5. The method of claim 1, wherein the flow rate of said $NH_3$ is about 100 sccm.

6. The method of claim 1, wherein the susceptor spacing of said pre-treatment is about 450 mils.

7. The method of claim 1, wherein said silicon oxide layer is formed by chemical vapor deposition and the reaction gases are $SiH_4$ and $N_2O$.

8. The method of claim 7, wherein the flow rate of said $N_2O$ is about 1600 sccm.

9. The method of claim 7, wherein the flow rate of said $SiH_4$ is about 90 sccm.

10. The method of claim 7, wherein said silicon oxide layer is formed at a power of about 240 watts.

11. The method of claim 7, wherein the susceptor spacing during formation of said silicon oxide layer is about 430 mils.

12. The method of claim 7, wherein said silicon oxide layer is formed at a pressure of about 2.5 torr.

13. The method of claim 7, wherein the temperature of forming said silicon oxide layer is about 200–400° C.

14. The method of claim 1, wherein said silicon nitride layer is formed by a method selected from the group consisting of low pressure chemical vapor deposition (LPCVD), plasma enhanced chemical vapor deposition (PECVD), or high density plasma chemical vapor Deposition (HDPCVD).

15. The method of claim 14, wherein the reaction gases of forming said silicon nitride layer are $SiH_4$ and $NH_3$.

16. The method of claim 15, wherein the flow rate of said $SiH_4$ is about 270 sccm.

17. The method of claim 15, wherein the flow rate of said $NH_3$ is about 80 sccm.

18. The method of claim 14, wherein said silicon nitride layer is formed at a power of about 760 watts.

19. The method of claim 14, wherein the susceptor spacing during the formation of said silicon nitride layer is about 650 mils.

20. The method of claim 14, wherein said silicon nitride layer is formed at a pressure of about 3.35 torr.

21. The method of claim 14, wherein the temperature of forming said silicon nitride layer is about 200–400° C.

22. The method of claim 14, further comprising the step of performing an oxidization process before forming said silicon oxide layer if said conductive layer is composed of aluminum.

* * * * *

UNITED STATES PATENT AND TRADEMARK OFFICE
CERTIFICATE OF CORRECTION

PATENT NO. : 6,103,639
DATED : August 15, 2000
INVENTOR(S) : T. Chang et al.

It is certified that error appears in the above-identified patent and that said Letters Patent is hereby corrected as shown below:

On the title page

Assistant    "ReneéR." should read --Renee R.--
            Examiner column 4      3    "SiII$_4$" should read --SiH$_4$--
   (Claim 7, line 3)

Signed and Sealed this

First Day of May, 2001

Attest:

NICHOLAS P. GODICI

Attesting Officer    Acting Director of the United States Patent and Trademark Office